United States Patent [19]
Noguchi

[11] Patent Number: 5,592,110
[45] Date of Patent: Jan. 7, 1997

[54] PHASE COMPARISON CIRCUIT FOR MAINTAINING A STABLE PHASE LOCKED LOOP CIRCUIT IN THE ABSENCE OF THE PULSE OF AN INPUT SIGNAL

[75] Inventor: Kenji Noguchi, Kanagawa, Japan

[73] Assignee: Mitsubishi Denki Kabushiki Kaisha, Tokyo, Japan

[21] Appl. No.: 428,343

[22] Filed: Apr. 25, 1995

[30] Foreign Application Priority Data

Nov. 11, 1994 [JP] Japan ................... 6-277670

[51] Int. Cl.⁶ .................. H03D 13/00; H03K 5/26; H03L 7/06
[52] U.S. Cl. .................. 327/12; 327/7; 327/157; 327/159; 331/1 A; 331/25
[58] Field of Search .................. 327/12, 7, 5, 2, 327/217, 218, 335, 3, 155, 156, 157, 159; 331/1 A, 25

[56] References Cited

U.S. PATENT DOCUMENTS

| | | | |
|---|---|---|---|
| 3,922,610 | 11/1975 | Buchan et al. | 327/12 |
| 4,020,422 | 4/1977 | Underhill | 327/12 |
| 4,531,102 | 7/1985 | Whitlock et al. | 331/11 |
| 4,583,053 | 4/1986 | Yarborough, Jr. | 327/12 |
| 4,594,563 | 6/1986 | Williams | 327/7 |
| 4,668,917 | 5/1987 | Levine | 327/12 |
| 4,984,255 | 1/1991 | Davis et al. | 331/25 |
| 5,266,851 | 11/1993 | Nukui | 327/12 |

FOREIGN PATENT DOCUMENTS 59-208932  11/1984  Japan ................... 327/12

Primary Examiner—Timothy P. Callahan
Assistant Examiner—Terry L. Englund
Attorney, Agent, or Firm—Oblon, Spivak, McClelland, Maier & Neustadt, P.C.

[57] ABSTRACT

A phase comparison circuit used in a phase locked loop circuit which realizes a stable phase locked loop circuit without changing the output frequency of a voltage-controlled oscillator, even if an input pulse is missing. The phase comparison circuit includes a circuit for generating a first pulse at each rising edge of an input signal, a circuit for generating a second pulse at each falling edge of the input signal, a circuit for generating a third pulse at each falling edge of a reference signal, a circuit for generating a first output signal from the first pulse and the second pulse, and a circuit for generating a second output signal from the first pulse and the third pulse. The output signals are not increased even if an input pulse is missing so that the operation of the phase locked loop circuit remains stable.

14 Claims, 7 Drawing Sheets

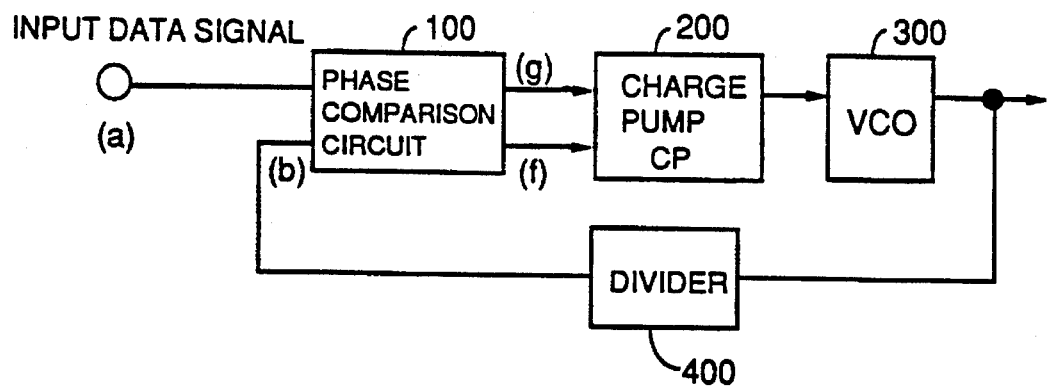
FIG. 7 PRIOR ART
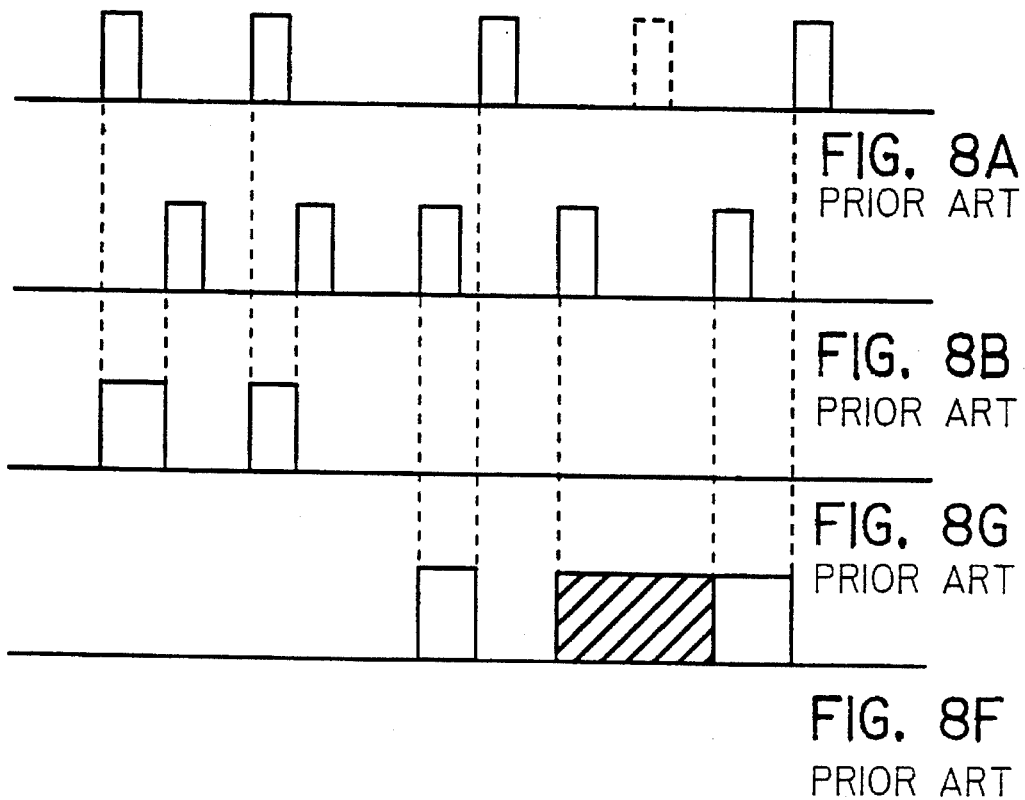
FIG. 8A PRIOR ART
FIG. 8B PRIOR ART
FIG. 8G PRIOR ART
FIG. 8F PRIOR ART

PHASE COMPARISON CIRCUIT FOR MAINTAINING A STABLE PHASE LOCKED LOOP CIRCUIT IN THE ABSENCE OF THE PULSE OF AN INPUT SIGNAL

BACKGROUND OF THE INVENTION

1. Field of the Invention

The invention relates to a phase comparison circuit used in PLL (phase lock loop) circuit. In particular, the present invention relates to a phase comparison circuit which keeps the PLL circuit stable, even when an input signal pulse falls out (missing).

2. Description of the Prior Art.

The PLL circuit is used to generate a reference signal according to a signal read out from the magnetic recording apparatus, optical disc apparatus and so on to reproduce a correct read out signal synchronized with this reference signal. The PLL circuit always compares a phase of the input signal with that of the output reference signal outputted from VCO (voltage controlled oscillator), and controls the resultant output voltage of VCO to produce a reference signal synchronized with the input signal.

FIG. 7 shows a conventional PLL circuit. FIG. 8 is a timing chart of FIG. 7 showing signal wave forms at corresponding portions of PLL. Signal wave forms (b), (g), and (f) in FIG. 8 correspond to signal voltages in the PLL circuit of FIG. 7, respectively.

In FIG. 7, the numeral 100 denotes a phase comparison circuit, the numeral 200 denotes a charge pump, the numeral 300 denotes a VCO (voltage controlled oscillator) and the numeral 400 denotes a frequency divider. The phase comparison circuit compares a phase of the input data signal (a) and that of the reference signal (b) outputted from the frequency divider 400. When the phase of reference signal (b) leads that of the input signal (a), an output signal (g) is generated.

When the phase of the input signal (a) is delayed with respect to to the phase of the reference signals (b), an output signal (f) is generated. The charge pump 200, for example, increases the output voltage when output signal (g) is inputted (UP output signal) and decreases the output voltage when output signal (f) is input (DOWN output signal). VCO 300 increases the output frequency when the input voltage rises, and descends it when the input voltage descends. This output frequency is divided by the frequency divider 400 and is dropped to the frequency almost the same as that of the input data signal (a).

In other words, the PLL circuit shifts forward the reference signal (b) when the phase of the input signal (a) is more advanced than that of the reference signal (b) and delays the reference signal (b) when the phase of input signal (a) is behind that of the reference signal (b). Thus, it always operates to synchronize the reference signal with the input signal.

However, in the PLL circuit as shown in FIG. 7, the output signal (g) is controlled to become 1 at rising edge of the input signal (a) and to become zero at rising edge of the reference signal (b). Therefore, when any of the input signal pulses is missing, as shown in the hatching portion of the output signal (f), the output signal (f), which changed to 1 at rising edge of the reference signal (b), cannot become zero and then remains in the state of 1 since the succeeding input signal (a) does not appear.

As a result, the output signal (f) makes the output voltage of charge pump 200 descend and the frequency of VCO 300 decrease. In case the input signal pulse is missing, neither the output signal (g) nor (f) must be generated. However, the voltage of the output signal is applied to the charge pump 200, which makes the output frequency of the VCO fluctuate. Therefore, the stable PLL could not be supplied as a result.

To solve this problem in the conventional method, the input data signal and the reference signal are compared after a predetermined amount of time after the input data signal or the reference signal have arrived. However, this conventional method had a disadvantage in that the accuracy and stability of the circuit which generates a predetermined amount of time affects directly upon the performance of the PLL circuit.

SUMMARY OF THE INVENTION

It is a primary object of the present invention to provide a phase comparison circuit used in the PLL circuit which removes such disadvantage.

The invention makes it possible to supply a phase comparison circuit which does not raise the output voltage supplied to a charge pump even if an input signal is missing. Hereby, even if an input signal pulse is missing, a stable PLL circuit can be provided without changing the output frequency of VCO.

According to one aspect of the present invention, there is provided a phase comparison circuit comprising a circuit for generating a first narrow width pulse (c) at rising edge of an input signal; a circuit for generating a second narrow width pulse (d) at falling edge of the input signal; a circuit for generating a third narrow width pulse (e) at falling edge of a reference signal; a circuit for generating a first output signal (f) from the first narrow width pulse and the second narrow width pulse; a circuit for generating a second output signal (d) from the first narrow width pulse and the third narrow width pulse.

According to another aspect of the present invention, there is provided a phase comparison circuit comprising a circuit for generating a second narrow width pulse (d) at falling edge of an input signal; a circuit for generating a third narrow width pulse (e) at falling edge of a reference signal; a circuit for generating the first output signal (f) from the input signal and the second narrow width pulse; a circuit for generating a second output signal (g) from the input signal and the third narrow width pulse.

According to still another aspect of the present invention, there is provided a phase comparison circuit comprising a circuit for generating a first narrow width pulse (c) at rising edge of an input signal; a circuit for generating a third narrow width pulse (e) at falling edge of a reference signal; and; a circuit for generating a first output signal (g) from the first narrow width pulse (c) and the third narrow width pulse (e), wherein a second output signal is equal to the input signal.

In the above aspect, the first output signal (f) decreases the frequency of the VCO and a second output signal (g) increases the frequency of the VCO.

The first output signal (f) rises by the input signal (a) or the first narrow width pulse (c) generated from the input signal (a), and falls by the input signal (a) or the second narrow width pulse (d) generated from the inverted input signal.

The second output signal (g) rises by the signal (a) or by the first narrow width pulse (c) generated from the input signal, and falls by the inverted reference signal (b) or the third narrow width pulse (e) generated from the inverted reference signal.

BRIEF DESCRIPTION OF THE DRAWINGS

FIG. 7 shows a conventional PLL circuit.

FIG. 8 is a timing chart showing signal wave forms at each portion in PLL circuit of FIG. 7.

DETAILED DESCRIPTION OF THE PREFERRED EMBODIMENTS

Embodiment 1

Figure 1:
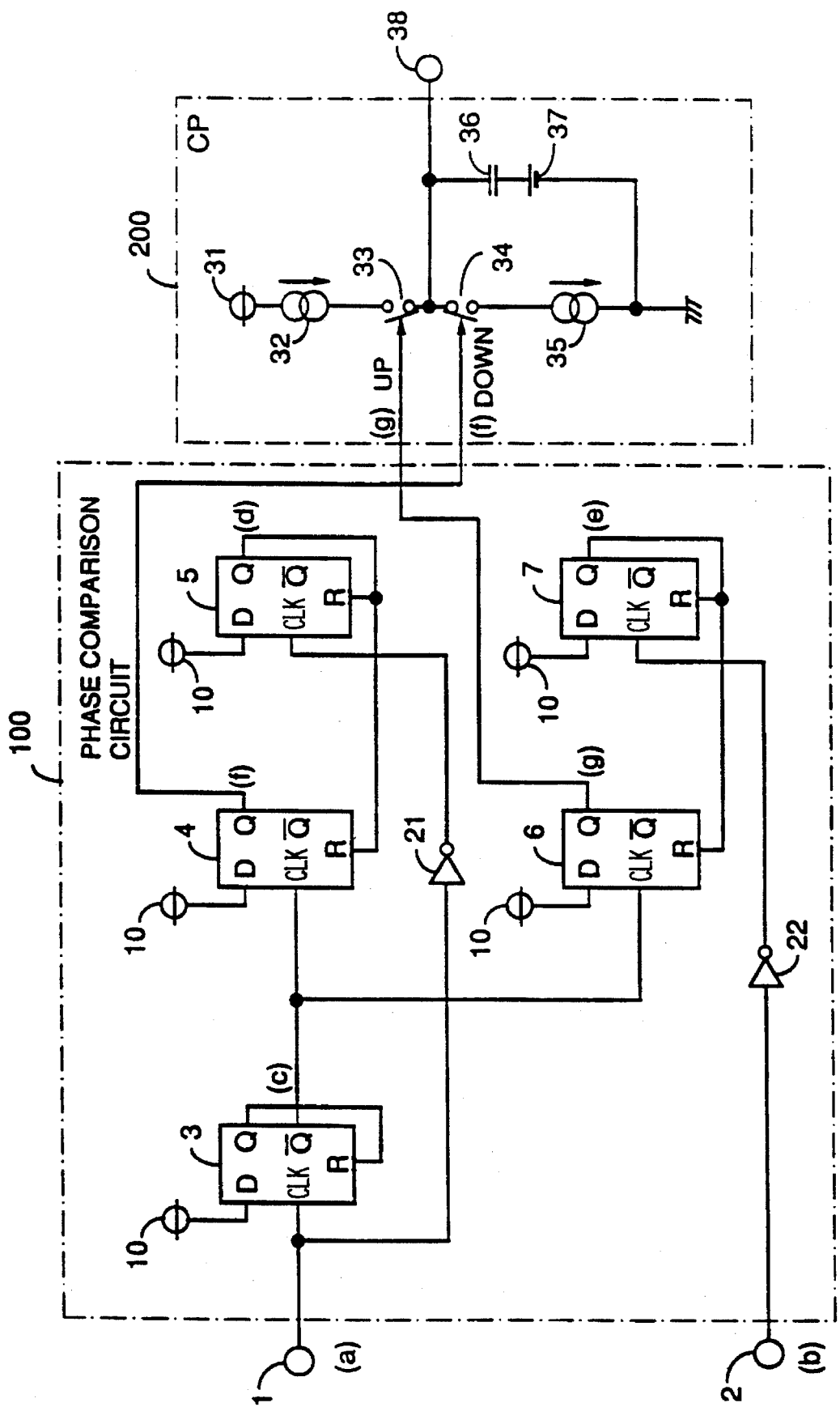
FIG. 1 is a circuit diagram of the phase comparison circuit of a first embodiment of the present invention.

FIG. 1 shows a phase comparison circuit of a first embodiment of the invention. The numeral 100 in FIG. 1 denotes a portion of the phase comparison circuit of the invention. The numeral 1 denotes an input terminal, the numeral 2 denotes a reference terminal, the numerals 3–7 denote D flip-flops, the numeral 10 denotes a power supply, the numerals 21 and 22 denote inverters. The numeral 200 denotes a charge pump (CP), the numeral 31 denotes a power supply, the numerals 32 and 35 denote current supply sources, the numerals 33 and 34 denote switches, the numeral 36 denotes a capacitor, the numeral 37 denotes a direct current power supply and the numeral 38 denotes an output terminal.

In the phase comparison circuit 100, the input terminal 1 is connected to the CLK terminal of D flip-flop 3 and the CLK terminal of D flip-flop 5 through the inverter 21. The reference terminal 2 is connected to the CLK terminal of D flip-flop 7 through the inverter 22. Each of the D terminals of D flip-flop are connected to the power supplies 10, respectively. The $\overline{Q}$ terminal of D flip-flop 3 is connected to the CLK terminal of D flip-flop 4 and the T terminal of D flip-flop 6. The Q terminal of D flip-flop 4 controls the switch 34 of the charge pump 200. The Q terminal of D flip-flop 6 controls the switch 33 of the charge pump 200.

The Q terminal of D flip-flop 5 is connected to the R terminal of D flip-flop and also to the reset R terminal of D flip-flop 4. The Q terminal of D flip-flop 7 is connected to the R terminal of D flip-flop 7 and also to the R terminal of D flip-flop 6.

In the charge pump 200, the current supply source 32 charges the capacitor 36 through the switch 33 and the current supply source 35 discharges the electric charge of the capacitor 36 through the switch 34. The summed voltage of the direct current power supply 37 and the capacitor 36 is supplied to the output terminal 38, which is applied to VCO 300 and controls the frequency of VCO as shown in FIG. 7.

Figure 2:
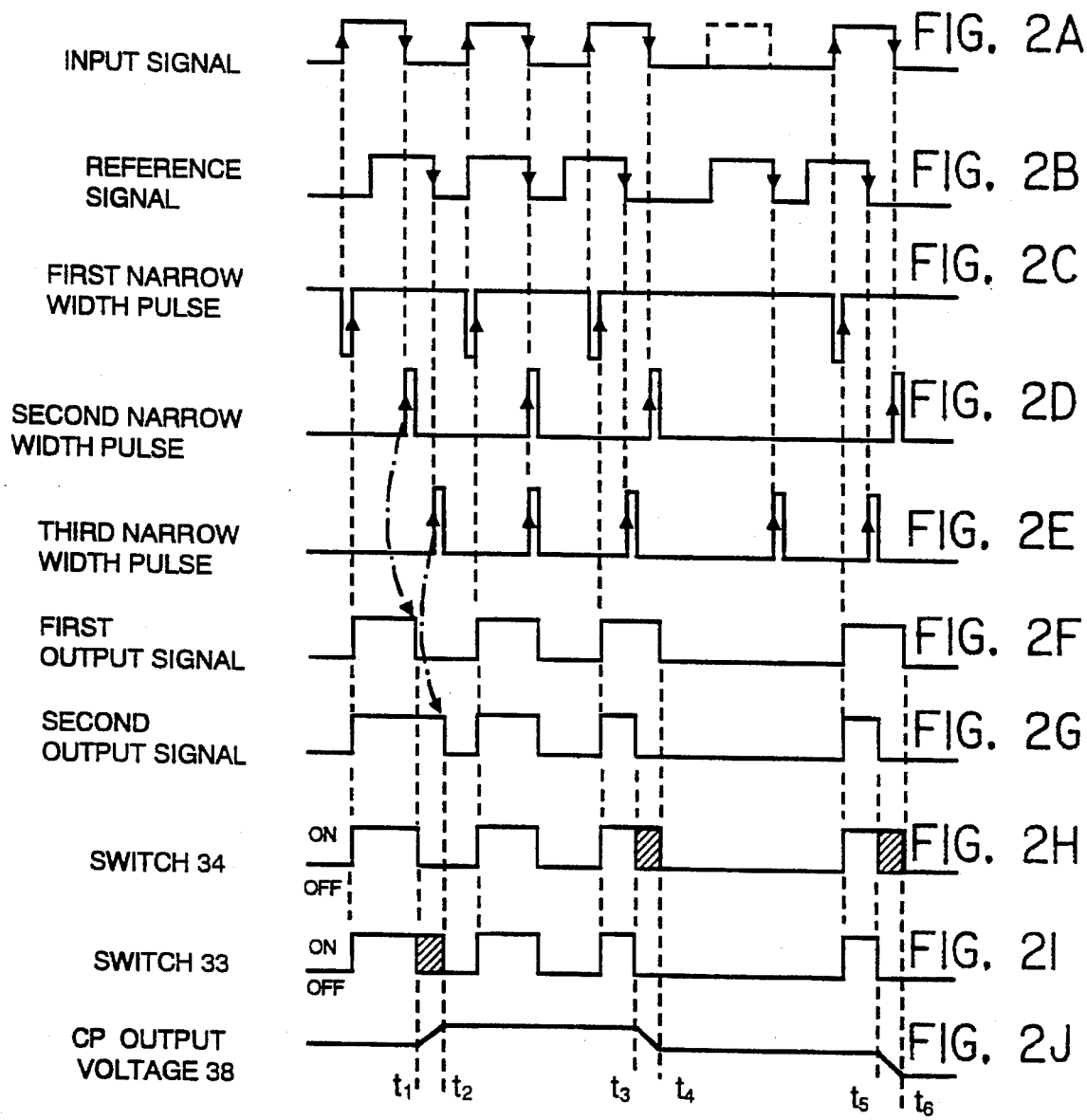
FIG. 2 shows s timing chart explaining the operation of FIG. 1.

An operation of the embodiment of FIG. 1 will be explained below using FIG. 2. FIG. 2 is a timing chart showing voltage wave forms at each portion of the circuit of FIG. 1. The inverted signal is obtained at the $\overline{Q}$ terminal of D flip-flop 3 when the pulse (a) is inputted into the input terminal 1. Since the Q terminal and the R terminal are connected in the D flip-flop 3, the signal of the Q terminal is added to the reset R terminal and then the signal of $\overline{Q}$ is reset after a predetermined delay. Therefore, the signal of $\overline{Q}$ terminal becomes the narrow pulse wave form as shown in FIG. 2.

The pulse (a) inputted into the input terminal 1 is inverted in inverter 21 and is applied to the CLK terminal of D flip-flop 5 and the output of D flip-flop 5 is then obtained from the Q terminal. However, since the Q terminal and the R terminal are connected, the signal of the Q terminal is applied to the reset R terminal after a predetermined delay and then the signal of the Q terminal defines narrow pulse wave forms as shown in (d).

The voltage (f) at the Q terminal of D flip-flop 4 becomes 1 at rising edge of $\overline{Q}$ signal of D flip-flop 3 and turns to zero after a predetermined delay of the rising edge of the Q terminal of D flip-flop 5. This wave form (f) is applied to the switch 34 to turn it on and off. On the other hand, the Voltage (g) in the Q terminal of D flip-flop 6 becomes 1 at rising edge of $\overline{Q}$ signal (c) of D flip-flop 3 and turns to zero a predetermined delay of the rising edge of the output (e) in the Q terminal of D flip-flop 7. This wave form (g) is applied to the switch 33 to turn it on and off.

In the charge pump 200, when the output signal (g) is 1 and the output signal (f) is zero, only the switch 33 is turned on and the electric charge is supplied to the capacitor 36 from the current supply source 32. On the other hand, when the output signal (g) is zero and the output signal (f) is 1, only the switch 34 is turned on, then the capacitor 36 discharges its electric charge through the current supply source 35. When both the output signal (g) and the output signal (f) are 1, a current from the current supply source 32 is supplied to the current supply source 35 through the switch 33 and switch 34 and the current sources do not contribute to the charge of the capacitor 36. When both the output signal (g) and the output signal (f) are zero, the electric charge of the capacitor 36 is maintained as it was because both the switch 33 and the switch 34 are opened.

Therefore, as shown in (h), (i) and (j) of FIG. 2, only the switch 33 turns on during time $t_1$ and $t_2$ and the electric charge is supplied to the capacitor 36 and then voltage of the output terminal 38 rises. During time $t_3$ and $t_4$ and during time $t_5$ and $t_6$, only the switch 34 is turned on and then voltage of the output terminal 38 descends as a result that the electric charge of the capacitor 36 discharges.

The voltage of this output terminal 38 is added to VCO 300 as shown in FIG. 7, and then changes the frequency of the output pulse of VCO 300. The pulse of VCO300 is supplied to the reference terminal 2 of the phase comparison circuit 100 through the frequency divider 400 as a reference signal to compare the input signal of the input terminal 1 with this reference signal. Since this description does not have a direct relationship with the invention, detailed description is omitted.

When a signal falls out (missing) in the phase comparison circuit 100, as shown by the dotted line of the input signal (a) in FIG. 2, the switch 33 and the switch 34 do not operate. Thus, the voltage of the output terminal 38 does not change and the operation of the phase comparison circuit 100 is stable during the missing happens.

The operation in case the input signal is missing is explained below. The output signals (f) and (g) which operate the switches 33 and 34 are generated by $\overline{Q}$ signal (c) of the D flip-flop 3. This $\overline{Q}$ signal is generated at the rising edge of the pulse (a) inputted into the input terminal 1. Therefore, when an input signal of the input terminal 1 is missing, there is no rising edge of the pulse (a) and then the $\overline{Q}$ signal (c) of D flip-flop 3 is not generated. Therefore, the output signal (f) and (g) are not generated as a result and then the switches 33 and 34 do not operate. Even if there is a missing of an input signal, the voltage from the output terminal 38 does not vary and the operation of the phase comparison circuit 100 is stable.

Embodiment 2

Figure 3:
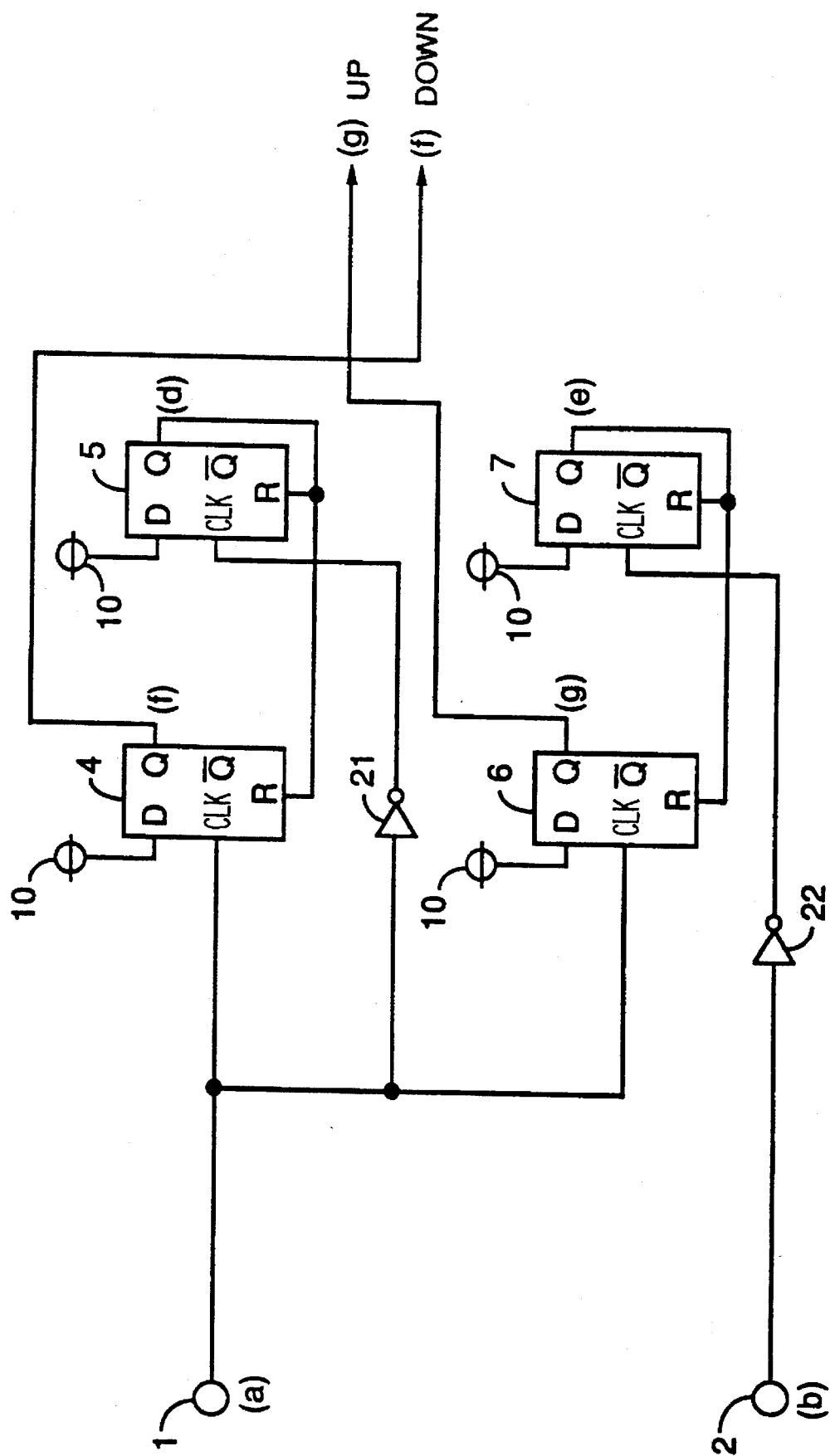
FIG. 3 is a circuit diagram of the phase comparison circuit of a second embodiment of the present invention.
Figure 4:
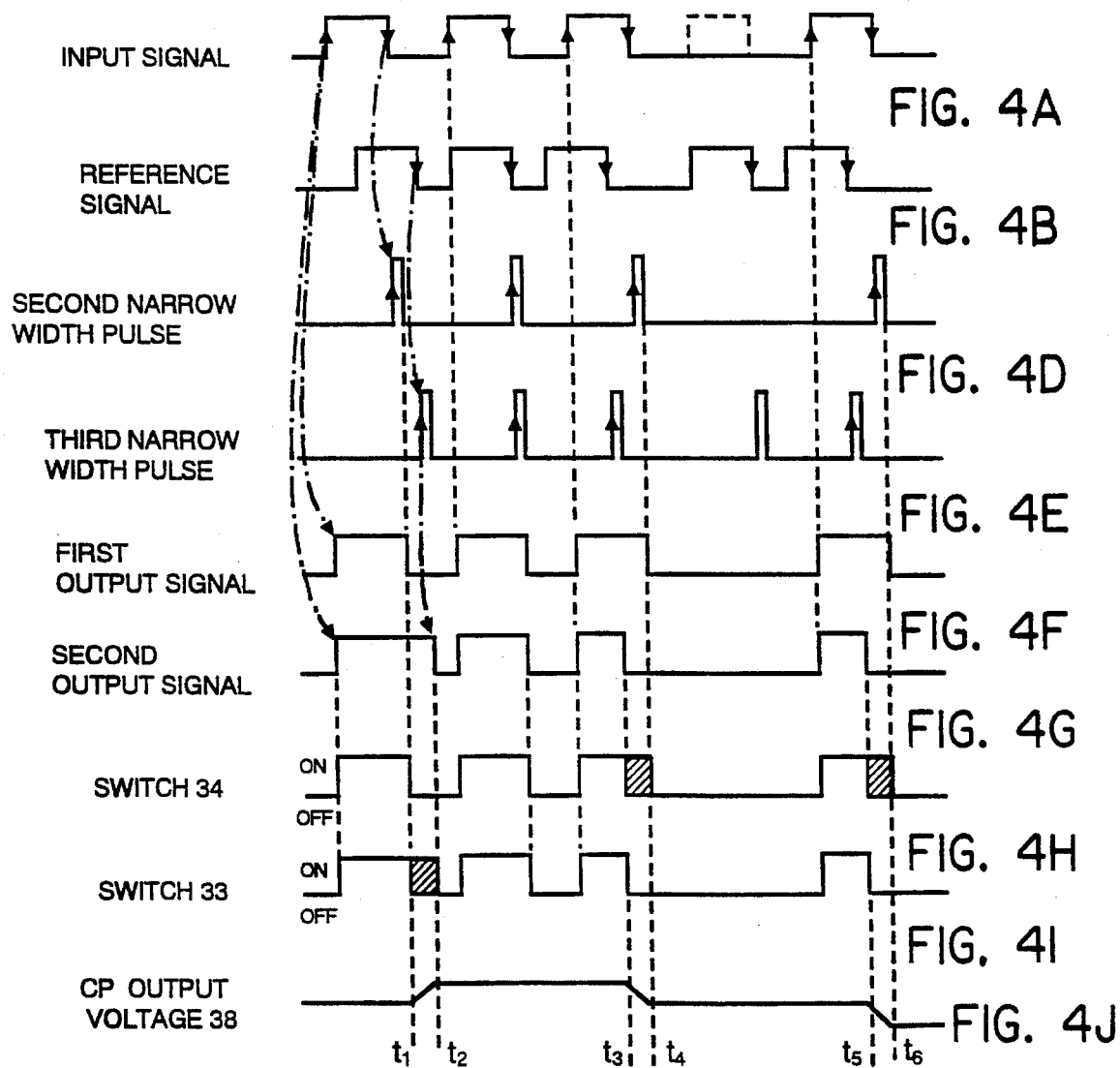
FIG. 4 shows a timing chart explaining the operation of FIG. 3.

FIG. 3 shows a phase comparison circuit of a second embodiment of the invention. FIG. 4 is a timing chart which shows each portion of FIG. 3. FIG. 3 is the same as that of FIG. 1 except that the D flip-flop 3 is removed from the circuit and the signal from the input terminal 1 is applied directly to the CLK terminal of D flip-flop 4 and to the input of the inverter 21 and to the CLK terminal of the D flip-flop 6.

An operation of the second embodiment is explained using FIG. 4. A process for generating the second narrow width pulse (d) and the third narrow width pulse (e) is the same as that in the embodiment 1. Only difference from the embodiment 1 is that the first narrow width pulse (c) is not generated by the input signal (a). Therefore, in this circuit, the rising edges of the output signal (f) and the output signal (g) are decided by the rising edge of the input signal (a) not by the rising edge of the narrow width pulse (c) as in the first embodiment. Other operations in the second embodiment are the same as that of the embodiment 1, and then further description is omitted. With such a construction, D flip-flop 3 can be omitted and then the circuit design becomes easier. It will contribute to make an integrated circuit smaller and less expensive.

Embodiment 3

Figure 5:
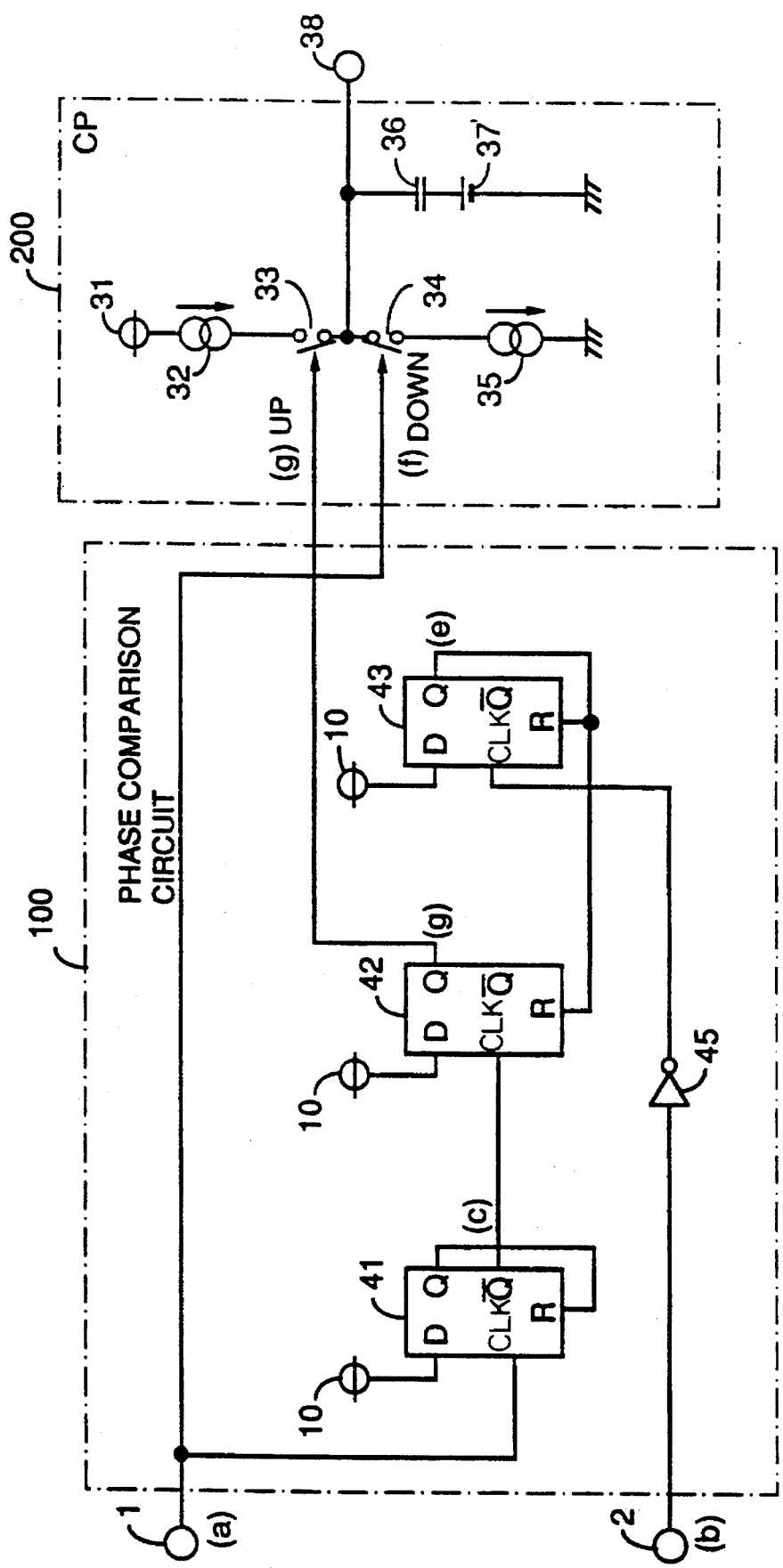
FIG. 5 is a circuit diagram of the phase comparison circuit of a third embodiment of the present invention.

FIG. 5 shows a phase comparison circuit of a third embodiment of the invention. In FIG. 5, the numeral 100 denotes a part of the phase comparison circuit of the invention. The numeral 1 denotes an input terminal, the numeral 2 denotes a reference terminal, the numerals 10 denotes a power supply, the numerals 41~43 denote D flip-flops and the numeral 45 denotes an inverter. The numeral 200 denotes a charge pump. The numeral 31 denotes a power supply, the numerals 32 and 35 denote current supply sources, the numerals 33 and 34 denote switches, the numeral 36 denotes a capacitor, the numeral 37 denotes a direct current power supply, the numeral 38 denotes an output terminal.

In the phase comparison circuit 100, the input terminal 1 is connected to the CLK terminal of D flip-flop 41 and the input pulse (a) controls the switch 34 directly. The input terminal 2 is connected to the CLK terminal of D flip-flop 43 through the inverter 45. Each D terminal of D flip-flop is connected to the power supply 10, respectively. The $\overline{Q}$ terminal of D flip-flop 41 is connected to the CLK terminal of the D flip-flop 42. The Q terminal of D flip-flop 42 is connected to the switch 33 of the charge pump 200. The Q terminal of the D flip-flop 43 are connected to the R terminal of the D flip-flop 43 and to the R terminal of the D flip-flop 42.

An operation of the charge pump 200 is the same as that in the embodiment 1. The current supply source 32 charges the capacitor 36 through the switch 33 and the current supply source 35 discharges electric charge in the capacitor 36 through the switch 34. The summed voltage of the direct current power supply 37 and the capacitor 36 is supplied to the output terminal 38 and is also applied to the VCO 300 which is not illustrated.

Figure 6:
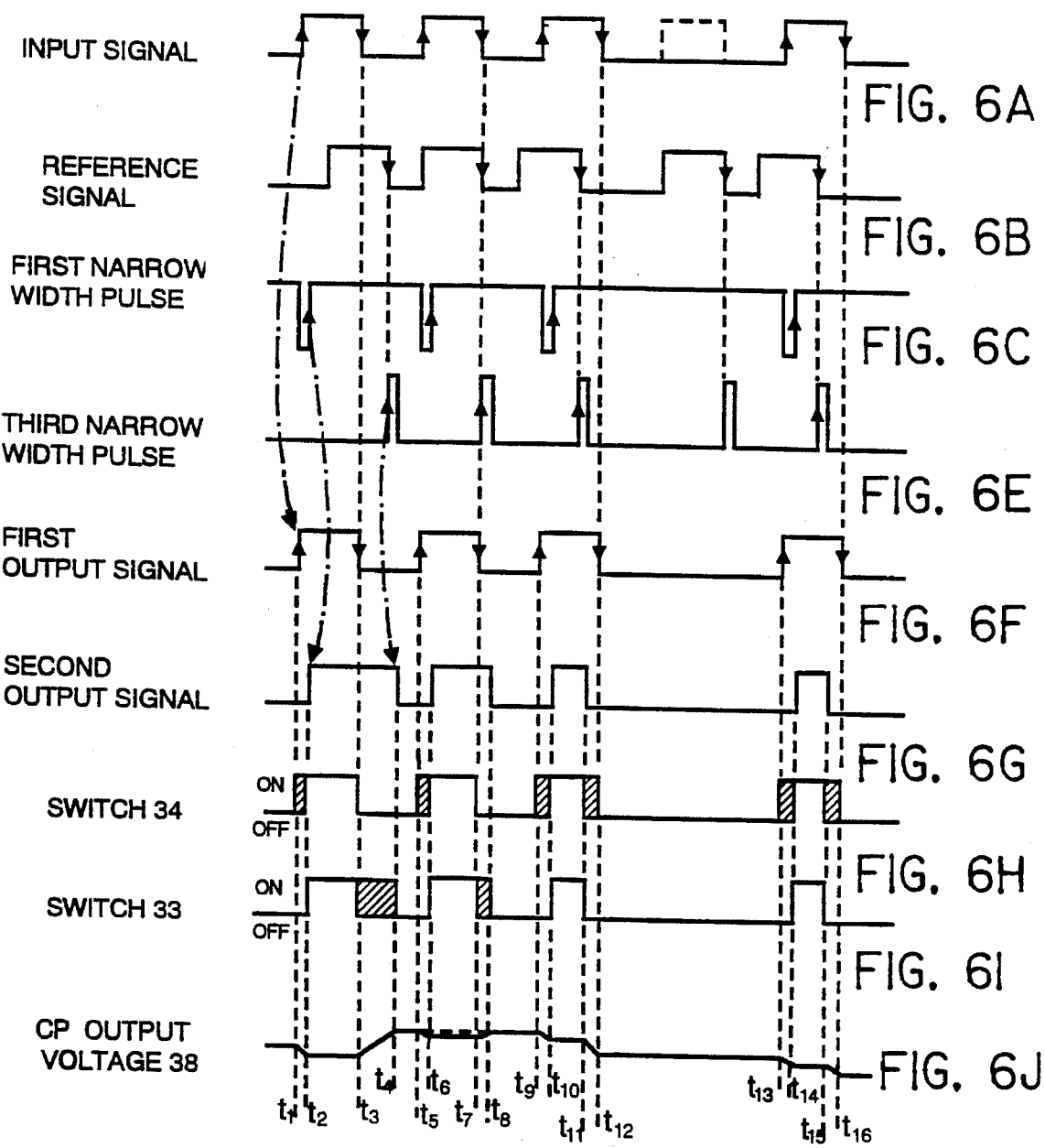
FIG. 6 shows a timing chart explaining the operation of FIG. 5.

An operation of the embodiment of FIG. 5 is explained below using FIG. 6. FIG. 6 is a timing chart showing voltage wave forms at respective portions of the circuit in FIG. 5. When the input pulse (a) is inputted into the input terminal 1, an inverted signal is obtained at the $\overline{Q}$ terminal of the D flip-flop 41. Since the Q terminal and the R terminal are connected together, the signal of the Q terminal is applied to the reset R terminal. Therefore, since the signal of $\overline{Q}$ is reset after a predetermined period of time, the $\overline{Q}$ terminal generates a narrow width wave form signal as shown in the wave form (c).

The signal at the input terminal 2 is inverted in the inverter 45 and is outputted to the CLK terminal of the D flip-flop 43. Since the Q terminal and the R terminal are connected, the signal of the Q terminal is applied to the reset R terminal. Since the signal of the Q is reset after a predetermined period of delay time, the Q terminal generates a narrow width wave form signal as shown in the wave form (e). The operation so far is the same as that in the embodiment 1.

The signal (a) input into the input terminal 1 is applied to the switch 34 as the output signal (f). As shown in (f) of FIG. 6, the switch 34 is turned on at rising edge of the output signal (f) and the switch 34 is turned off at the falling edge. On the other hand, the signal (g) at the Q terminal of D flip-flop 42 becomes 1 at rising edge of signal (c) and it becomes zero at rising edge of $\overline{Q}$ signal (e) of D flip-flop 43. This wave form (g) is applied to the switch 33 and turns it on and off.

In the charge pump 200, when the output signal (f) is 1 and the output signal (g) is zero, only the switch 34 is turned on and then the capacitor 36 discharges the electric charge through the current supply source 35. When the output signal (f) is zero and the output signal (g) is 1, only the switch 33 is turned on, then the electric charge is charged from the current supply source 32 to the capacitor 36. On the other hand, when both the output signal (f) and the output signal (g) are 1, a current from the current supply source 32 flows into the current supply source 35 through the switch 33 and the switch 34. It does not contribute to the electric charge of the capacitor 36. When both the output signal (f) and output signal (g) are zero, the switch 33 and switch 34 are both open and the electric charge of the capacitor 36 is maintained as it was.

Therefore, as shown in (h), (i) and (j) of FIG. 6, during time $t_3$–$t_4$ and during time $t_7$–$t_8$, only the switch 33 is turned on and then the capacitor 36 is charged and the voltage of the output terminal 38 rises. On the other hand, during time $t_1$–$t_2$, time $t_5$–$t_6$, time $t_9$–$t_{10}$, time $t_{11}$–$t_{12}$, time $t_{13}$–$t_{14}$ and time $t_{15}$–$t_{16}$, only the switch 34 is turned on and then the capacitor 36 discharges the electric charge. The voltage of the output terminal 38 descends as a result.

The voltage of the output terminal 38 of the charge pump is applied to VCO 300 as shown in FIG. 7, and changes the frequency of the output pulse of VCO 300. The pulse of VCO 300 is supplied to the reference terminal 2 of the phase comparison circuit 100 through the frequency divider 400 as a reference signal. The input signal of the input terminal 1 is compared with this reference signal. This operation is the same as that in the embodiment 1 and the detailed description is omitted as there is no direct relationship with the invention.

When an input signal falls out (missing) in this circuit, as shown by the dotted line of the input signal (a) in FIG. 6, the switches 33 and 34 do not operate in the same way as explained in the embodiment 1. Therefore, the voltage of the output terminal 38 does not change and the operation of the phase comparison circuit 100 is stable.

What is claimed is:

1. A phase comparison circuit comprising:

a first circuit for generating a first pulse at each rising edge of an input signal;

a second circuit for generating a second pulse at each falling edge of the input signal;

a third circuit for generating a third pulse at each falling edge of a reference signal;

a fourth circuit, connected to said first and second circuits, for receiving said first and second pulses and generating a first output signal; and a fifth circuit, connected to said first and third circuits, for receiving said first and third pulses and generating a second output signal.

2. The phase comparison circuit of claim 1, wherein said first circuit comprises a D-type flip-flop, and said input signal is applied to the clock terminal of the D-type flip-flop and the Q terminal thereof is connected to the reset terminal thereof;

said second circuit comprises a D-type flip-flop, and an inverted signal of said input signal is applied to the clock terminal of the D-type flip-flop and the Q terminal thereof is connected to the reset terminal thereof;

said third circuit comprises a D-type flip-flop, and an inverted signal of said reference signal is applied to the clock terminal of the D-type flip-flop and the Q terminal thereof is connected to the reset terminal thereof;

said fourth circuit comprises a D-type flip-flop, and said first pulse is applied to the clock terminal of the D-type flip-flop and said second pulse is applied to the reset terminal of the D-type flip-flop; and said fifth circuit comprises a D-type flip-flop, and said first pulse is applied to the clock terminal of the D-type flip-flop and said third pulse is applied to the reset terminal of the D-type flip-flop.

3. A phase comparison circuit comprising:

a first circuit for generating a first pulse at each falling edge of an input signal;

a second circuit for generating a second pulse at each falling edge of a reference signal;

a third circuit, connected to said first circuit, for receiving said input signal and said first pulse and generating a first output signal; and a fourth circuit, connected to said second circuit, for receiving said input signal and said second pulse and generating a second output signal.

4. The phase comparison circuit of claim 3, wherein said first circuit comprises a D-type flip-flop, and an inverted signal of said input signal is applied to the clock terminal of the D flip-flop and the Q terminal thereof is connected to the reset terminal thereof;

said second circuit comprises a D-type flip-flop, and an inverted signal of said reference signal is applied to the clock terminal of the D-type flip-flop and the Q terminal thereof is connected to the reset terminal thereof;

said third circuit comprises a D-type flip-flop, and said input signal is applied to the clock terminal of the D-type flip-flop and said first pulse is applied to the reset terminal of the D-type flip-flop; and said fourth circuit comprises a D-type flip-flop, and said input signal is applied to the clock terminal of the D-type flip-flop and said second pulse is applied to the reset terminal of the D-type flip-flop.

5. A phase comparison circuit comprising:

a first circuit for generating a first pulse at each rising edge of an input signal;

a second circuit for generating a second pulse at each falling edge of a reference signal;

output means, responsive to said input signal, for generating a first output signal in accordance with said input signal; and a third circuit, connected to said first and second circuits, for receiving said first and second pulses and generating a second output signal.

6. The phase comparison circuit of claim 5, wherein said first circuit comprises a D-type flip-flop, and said input signal is applied to the clock terminal of the D-type flip-flop and the Q terminal thereof is connected to the reset terminal thereof;

said second circuit comprises a D-type flip-flop, and an inverted signal of said reference signal is applied to the clock terminal of the D-type flip-flop and the Q terminal thereof is connected to the reset terminal thereof; and said third circuit comprises a D-type flip-flop, and said first pulse is applied to the clock terminal of the D-type flip-flop and said second pulse is applied to the reset terminal of the D-type flip-flop.

7. A phase lock loop circuit comprising:

a phase comparison circuit for outputting a first signal and a second signal in response to an input signal and a reference signal;

a charge pump circuit for outputting an output voltage in response to said first and second signals received from said phase comparison circuit;

a voltage controlled oscillator for outputting an output signal whose frequency is controlled in response to said output voltage received from said charge pump circuit; and a frequency dividing circuit for outputting said reference signal to said phase comparison circuit by dividing said output signal received from said voltage controlled oscillator;

wherein said phase comparison circuit comprises a first signal output means for receiving said input signal and outputting said first signal which rises in response to a rising edge of said input signal and falls in response to a falling edge of said input signal, a second signal output means for receiving said input signal and said reference signal and outputting said second signal which rises in response to the rising edge of said input signal and falls in response to a falling edge of said reference signal only when said second signal has risen in response to said input signal.

8. The phase lock loop circuit of claim 7, wherein said charge pump circuit comprises a first current supply source;

a second current supply source;

a first switching means, connected between said first current supply source and an output node where said output voltage is outputted, for turning-on in response to high level of said first signal received from said phase comparison circuit, and turning-off in response to low level of said first signal; and a second switching means, connected between said second current supply source and said output node where said output voltage is outputted, for turning-on in response to high level of said second signal received from said phase comparison circuit, and turning-off in response to low level of said second signal.

9. The phase lock loop circuit of claim 7, wherein said first signal output means comprises a first pulse generating means, in response to said input signal, for generating a first pulse having a narrower pulse width than that of said input signal, which falls in response to the rising edge of said input signal, a second pulse generating means, in response to said input signal, for generating a second pulse having a narrower pulse width than that of said input signal, which rises in response to the falling edge of said input signal, and a first signal generating means, in response to the first pulse from said first pulse generating means and the second pulse from said second pulse generating means, for outputting said first signal which rises in response to said first pulse and falls in response to said second pulse;

said second signal output means comprises, said first pulse generating means, a third pulse generating means, in response to said reference signal, for generating a third pulse having a narrower pulse width than that of said input signal, which rises in response to the falling edge of said reference signal, and a second signal generating means, in response to the first pulse from said first pulse generating means and the third pulse from said third pulse generating means, for outputting said second signal which rises in response to said first pulse and falls in response to said third pulse only after said second signal has risen in response to said first pulse.

10. The phase lock loop circuit of claim 9, wherein said first pulse generating means comprises a first D-type flip-flop having a clock terminal where said input signal is inputted, an input terminal connected to a voltage supply node, a first output terminal, a reset terminal connected to said first output terminal, and a second output terminal for outputting said first pulse;

said second pulse generating means comprises a first inverting means, in response to said input signal for outputting the inverted signal of said input signal, and a second D-type flip-flop having a clock terminal where said inverted signal of said input signal from said first inverting means is inputted, an input terminal connected to said voltage supply node, an output terminal for outputting said second pulse, and a reset terminal connected to said output terminal;

said first signal generating means comprises a third D-type flip-flop having a clock terminal connected to the second output terminal of said first D-type flip-flop, an input terminal connected to said voltage supply node, a reset terminal connected to the output terminal of said second D-type flip-flop, and an output terminal for outputting said first signal;

said third pulse generating means comprises a second inverting means, in response to said reference signal, for outputting the inverted signal of said reference signal, and a fourth D-type flip-flop having a clock terminal where said inverted signal of said reference signal from said second inverting means is inputted, an input terminal connected to said voltage supply node, an output terminal for outputting said third pulse, and a reset terminal connected to said output terminal; and said second signal generating means comprises a fifth D-type flip-flop having a clock terminal connected to the second output terminal of said first D-type flip-flop, an input terminal connected to said voltage supply node, a reset terminal connected to the output terminal of said fourth D-type flip-flop and an output terminal for outputting said second signal.

11. The phase lock loop circuit of claim 7, wherein said first signal output means comprises a first pulse generating means, in response to said input signal for generating a first pulse having a narrower pulse width than that of said input signal, which rises in response to the falling edge of said input signal, and a first signal generating means, in response to said input signal and the first pulse from said first pulse generating means, for outputting said first signal which rises in response to said rising edge of said input signal received and falls in response to said first pulse; and said second signal output means comprises a second pulse generating means, in response to said reference signal, for generating a second pulse having a narrower pulse width than that of said input signal, which rises in response to the falling edge of said reference signal, and a second signal generating means, in response to said input signal and the second pulse from said second pulse generating means, for outputting said second signal which rises in response to the rising edge of said input signal and falls in response to said second pulse only after said second signal has risen in response to said input signal.

12. The phase lock loop circuit claim 11, wherein said first pulse generating means comprises a first inverting means, in response to said input signal, for outputting the inverted signal of said input signal, and a first D-type flip-flop having a clock terminal where said inverted signal of said input signal from said first inverting means is inputted, an input terminal connected to a voltage supply node, an output terminal for outputting said first pulse, and a reset terminal connected to said output terminal;

said first signal generating means comprises a second D-type flip-flop having a clock terminal where said input signal is inputted, an input terminal connected to said voltage supply node, a reset terminal connected to the output terminal of said first D-type flip-flop, and an output terminal for outputting said first signal;

said second pulse generating means comprises a second inverting means, in response to said reference signal, and outputting the inverted signal of said reference signal, and a third D-type flip-flop having a clock terminal where said inverted signal of said reference signal from said second inverting means is inputted, an input terminal connected to said voltage supply node, an output terminal for outputting said second pulse, and a reset terminal connected to said output terminal; and said second signal generating means comprises a fourth D-type flip-flop having a clock terminal where said input signal is inputted, an input terminal connected to said voltage supply node, a reset terminal connected to the output terminal of said third D-type flip-flop, and an output terminal for outputting said second signal.

13. The phase lock loop circuit of claim 7, wherein said first signal output means provides a wiring for transmitting said input signal to said charge pump circuit as said first signal;

said second signal output means comprises, a first pulse generating means, in response to said input signal, for generating a first pulse having a narrower pulse width than that of said input signal, which falls in response to the rising edge of said input signal;

a second pulse generating means, in response to said reference signal, for generating a second pulse having a narrower pulse width than that of said input signal, which rises in response to the falling edge of said reference signal; and a first signal generating means, in response to the first pulse from said first pulse generating means and the second pulse from said second pulse generating means, for outputting said second signal which rises in response to said first pulse and falls in response to said second pulse only after said second signal has risen in response to said first pulse.

14. The phase lock loop circuit of claim 13, wherein said first pulse generating means comprises a first D-type flip-flop having a clock terminal where said input signal in inputted, an input terminal connected to a voltage supply node, a first output terminal, a reset terminal connected to said first output terminal, and a second output terminal for outputting said first pulse;

said second pulse generating means comprises a first inverting means, in response to said reference signal, for outputting the inverted signal of said reference signal, and a clock terminal where said inverted signal of said reference signal from first inverting means is inputted, an input terminal connected to said voltage supply node, an output terminal for outputting said second pulse, and a reset terminal connected to said output terminal; and said first signal generating means comprises a third D-type flip-flop having a clock terminal connected to the second output terminal of said first D-type flip-flop, an input terminal connected to said voltage supply node, a reset terminal connected to the output terminal of said second D-type flip-flop, and an output terminal for outputting said second signal.

\* \* \* \* \*